(12) United States Patent
Kuroyanagi et al.

(10) Patent No.: US 8,093,560 B2
(45) Date of Patent: Jan. 10, 2012

(54) PHOTOCONDUCTIVE ANTENNA ELEMENT

(75) Inventors: Kazuyoshi Kuroyanagi, Hamamatsu (JP); Kazutoshi Nakajima, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 12/738,163

(22) PCT Filed: Oct. 24, 2008

(86) PCT No.: PCT/JP2008/069308
§ 371 (c)(1),
(2), (4) Date: Apr. 15, 2010

(87) PCT Pub. No.: WO2009/063733
PCT Pub. Date: May 22, 2009

(65) Prior Publication Data
US 2010/0230596 A1 Sep. 16, 2010

(30) Foreign Application Priority Data
Nov. 14, 2007 (JP) ................ P2007-295978

(51) Int. Cl.
*G01J 5/02* (2006.01)

(52) U.S. Cl. ................. 250/341.1

(58) Field of Classification Search .... 250/338.1–338.4, 250/341.1–341.8
See application file for complete search history.

(56) References Cited

U.S. PATENT DOCUMENTS

2006/0151722 A1* 7/2006 Cole et al. ............ 250/493.1
2008/0315098 A1* 12/2008 Itsuji .................... 250/330

FOREIGN PATENT DOCUMENTS

| JP | 2000-207288 | 7/2000 |
| JP | 2002-223017 | 8/2002 |
| JP | 2004-207288 | 7/2004 |
| JP | 2004-363485 | 12/2004 |
| JP | 2006-170822 | 6/2006 |

OTHER PUBLICATIONS

Smith et al., "Subpicosecond photoconducting dipole antenna," 1988, IEEE Journal of quantum Electronics, vol. 24, No. 2, pp. 255-260.*

(Continued)

*Primary Examiner* — Kiho Kim
(74) *Attorney, Agent, or Firm* — Drinker Biddle & Reath LLP

(57) ABSTRACT

This invention relates to a photoconductive antenna element having a structure capable of preventing element characteristics from deteriorating and attain a smaller size at the same time. This photoconductive antenna element (17) comprises a pair of electrodes (21) formed on a semiconductor layer (19). Each electrode (21) is constituted by an antenna part (22), pad parts (23), and a line part (24) connecting them, while the line part (24) includes a parallel portion (24a) extending from the antenna part (22). In the line part (24) of one electrode (21), a portion other than the antenna region (A) is bent opposite to the other electrode (21). In the line part (24) of the other electrode (21), a portion other than the antenna region (A) is bent opposite to the one electrode (21). This structure can prevent the photoconductive antenna element (17) from deteriorating its element characteristics and make it smaller.

7 Claims, 14 Drawing Sheets

OTHER PUBLICATIONS

Raspopin et al., "A frequency-selective terahertz radiation detector based on a semiconductor superlattice with a resonator,", 2002, IEEE, The Science and technology of nano and molecular electronics: physics, simulation, and experimental characterization, pp. 107-109.*

Mukulics et al., "Traveling-wave photomixer with recessed interdigitated contacts on low-temperature-grown GaAs,", 2006, Applied Physics Letters, vol. 88, pp. 041118-1 to 04118-3.*

Huggard et al., "Polarization-dependent efficiency of phtoconducting THz transmitters and receivers," 1998, Applied Physics Letters, vol. 72, No. 17, pp. 2069-2071.*

Kida et al., "Terahertz optics in strongly correlated electron systems," 2005, Terahertz Optoelectronics, Topics in Applied Physics, vol. 97, pp. 271-331.*

Dragomann et al., "Terahertz fields and applications," 2004, Progess in Quantum Electronics, vol. 28, pp. 1-66.*

M. Tani et al., "Emission characteristics of photoconductive antennas based on low-temperature-grown GaAs and semi-insulating GaAs," Applied Optics, Oct. 20, 1997, vol. 36, No. 30, pp. 7853-7859.

M. Tani et al., "Generation and detection of terahertz pulsed radiation with photoconductive antennas and its application to imaging," Measurement Science and Technology, Institute of Physics Publishing, 2002, vol. 13, pp. 1739-1745.

* cited by examiner (a)

(b)

(a)

(b)

(a)

(b)

(a)

(b)

(a)

(b)

(a)

(b)

(a)

(b)

(a)

(b)

(a)

(b)

PHOTOCONDUCTIVE ANTENNA ELEMENT

TECHNICAL FIELD

The present invention relates to a photoconductive antenna element for generating or detecting a terahertz electromagnetic wave.

BACKGROUND ART

The following has been typical as a conventional photoconductive antenna. That is one in which each of a pair of electrodes formed on a semiconductor layer is constituted by an antenna part forming an antenna region for generating or detecting a terahertz electromagnetic wave, a pad part connectable to an external lead, and a line part connecting the antenna and pad parts to each other. Here, the line part is formed linear (see, for example, Patent Document 1). The line part in a pair of electrodes is thus formed linear, since characteristics of the photoconductive antenna element will deteriorate unless the line part has a predetermined linear length.
Patent Document 1: Japanese Patent Application Laid-Open No. 2004-207288

DISCLOSURE OF THE INVENTION

Problems that the Invention is to Solve

The present inventors have examined conventional photoconductive antenna elements, and as a result, have discovered the following problems. That is, as technical demands for the photoconductive antenna elements, they have been desired to be made smaller per se in order to improve their productivity and reduce the size of apparatus employing the photoconductive antenna elements. However, the conventional photoconductive elements have been problematic in that they are inhibited from being made smaller since their element characteristics will deteriorate unless the line part in the pair of electrodes has a linear form with a predetermined length.

The present invention has been developed to eliminate the problems described above. It is an object of the present invention to provide a photoconductive antenna element having a structure capable of preventing element characteristics from deteriorating and attain a smaller size at the same time.

Means for Solving the Problems

The photoconductive antenna element according to the present invention is a photoconductive antenna element for generating or detecting a terahertz electromagnetic wave comprising a semiconductor layer and a pair of electrodes formed on the semiconductor layer in order to achieve the above-mentioned object. In particular, each of the pair of electrodes has an antenna part forming an antenna region for generating or detecting a terahertz electromagnetic wave, a pad part connectable to an external lead, and a line part connecting the antenna and pad parts to each other. The line part in each of the pair of electrodes includes lead portions parallel to each other each arranged by bending at least one position between the antenna region and the pad part.

In the photoconductive antenna element according to the present invention, the lead portions in the line part in one of the pair of electrodes and the lead portions in the line part in the other of the pair of electrodes extend in directions opposite to each other with respect to the antenna region. The photoconductive antenna element having such an electrode form can keep characteristics equivalent or superior to those of the conventional photoconductive antenna elements provided with a line part having a predetermined linear length and can be made smaller than the conventional photoconductive antenna elements. When the antenna part is in a dipole pattern, bowtie pattern, or the like, the lead portions preferably extend in a direction substantially orthogonal to a direction in which the antenna parts oppose each other between the electrodes. There is a case where the semiconductor layer is a GaAs layer epitaxially grown on a semi-insulating GaAs substrate at a temperature lower than usual.

In the photoconductive antenna element according to the present invention, the line part in one of the pair of electrodes is bent opposite to the other of the pair of electrodes. In contrast, the line part in the other of the pair of electrodes is bent opposite to the one of the pair of electrodes. The photoconductive antenna element having such an electrode form allows the antenna, pad, and line parts to be arranged efficiently on the semiconductor layer. This can effectively prevent the photoconductive antenna element itself from deteriorating its characteristics and further reduce its size.

Preferably, in the photoconductive antenna element according to the present invention, the line part of at least one of the pair of electrodes includes a routing portion located between the antenna part and one of the lead portions and constituted by a plurality of linear elements. The photoconductive antenna element having such an electrode form can reliably keep characteristics equivalent or superior to those of the conventional photoconductive antenna elements whose line part has a predetermined linear length.

In particular, the plurality of linear elements constituting the routing portion are arranged parallel to the lead portions. A linear element having both sides adjacent to linear elements is formed such as to have one end connected to one of the adjacent linear elements and the other end connected to the other of the adjacent linear elements. Thus alternately changing the connecting positions of the adjacent linear elements can achieve efficient routing of the line part and increase the total length of the line part.

In the photoconductive antenna element according to the present invention, it is preferable that the semiconductor layer includes a GaAs layer epitaxially grown on a semi-insulating GaAs substrate at a temperature lower than usual.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the scope of the invention will be apparent to those skilled in the art from this detailed description.

Effects of the Invention

The photoconductive antenna element according to the present invention can prevent element characteristics from deteriorating and attain a smaller size at the same time.

DESCRIPTION OF THE REFERENCE NUMERALS

14 . . . signal lead (external lead); 15 . . . grounding lead (external lead); 17 . . . photoconductive antenna element; 19 . . . GaAs layer (semiconductor layer); 21 . . . ohmic electrode (electrode); 22 . . . antenna part; 23 . . . pad part; 24 . . . line part; 24a . . . parallel portion; 24c . . . routing portion; and A . . . antenna region.

BEST MODES FOR CARRYING OUT THE INVENTION

In the following, embodiments of the photoconductive antenna element according to the present invention will be explained in detail with reference to FIGS. 1 to 14. In the explanation of the drawings, the same constituents and parts will be referred to with the same signs while omitting their overlapping descriptions.

Figure 1:
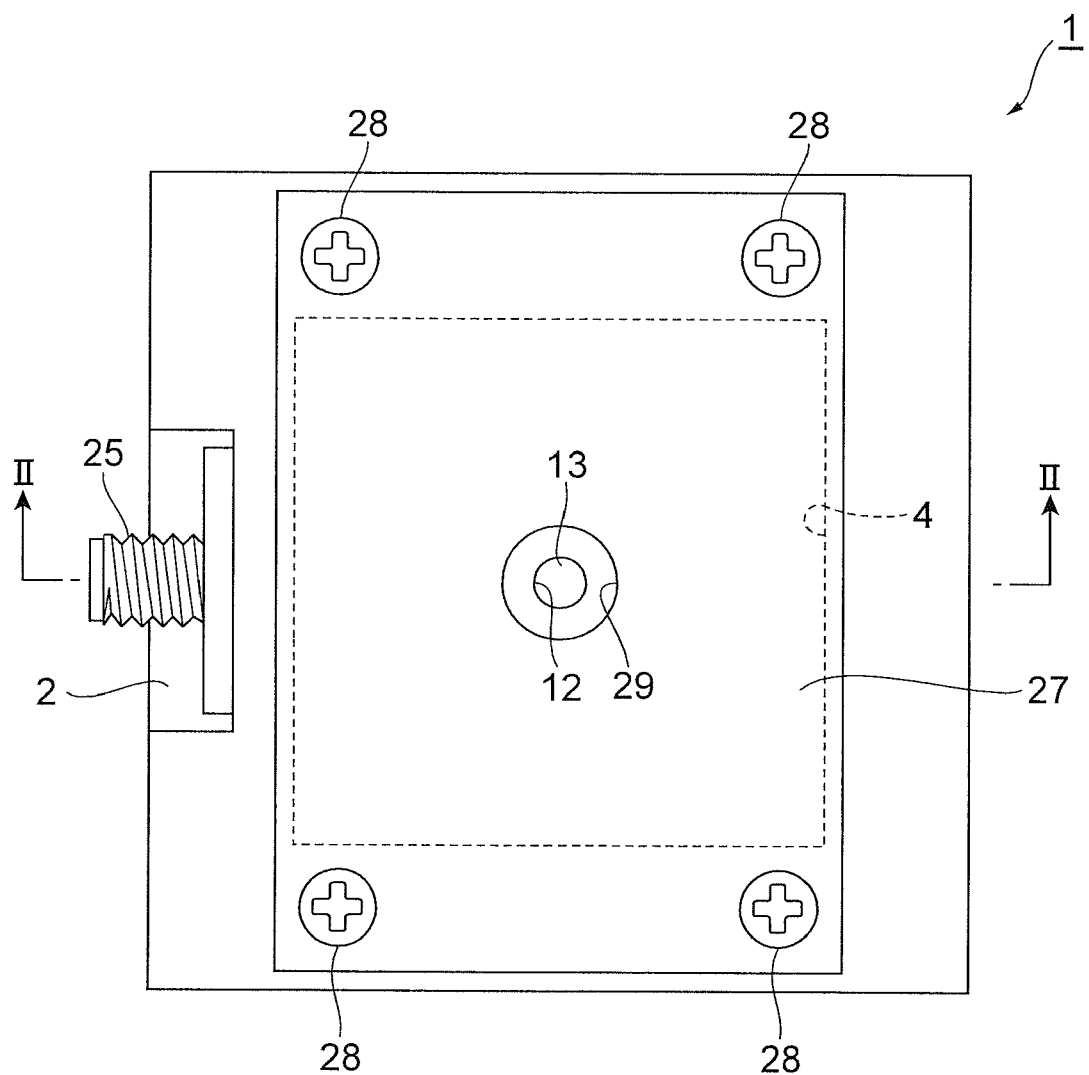
FIG. 1 is a rear view of a terahertz electromagnetic wave generating/detecting module in which each of embodiments of the photoconductive antenna element according to the present invention is employable.
Figure 2:
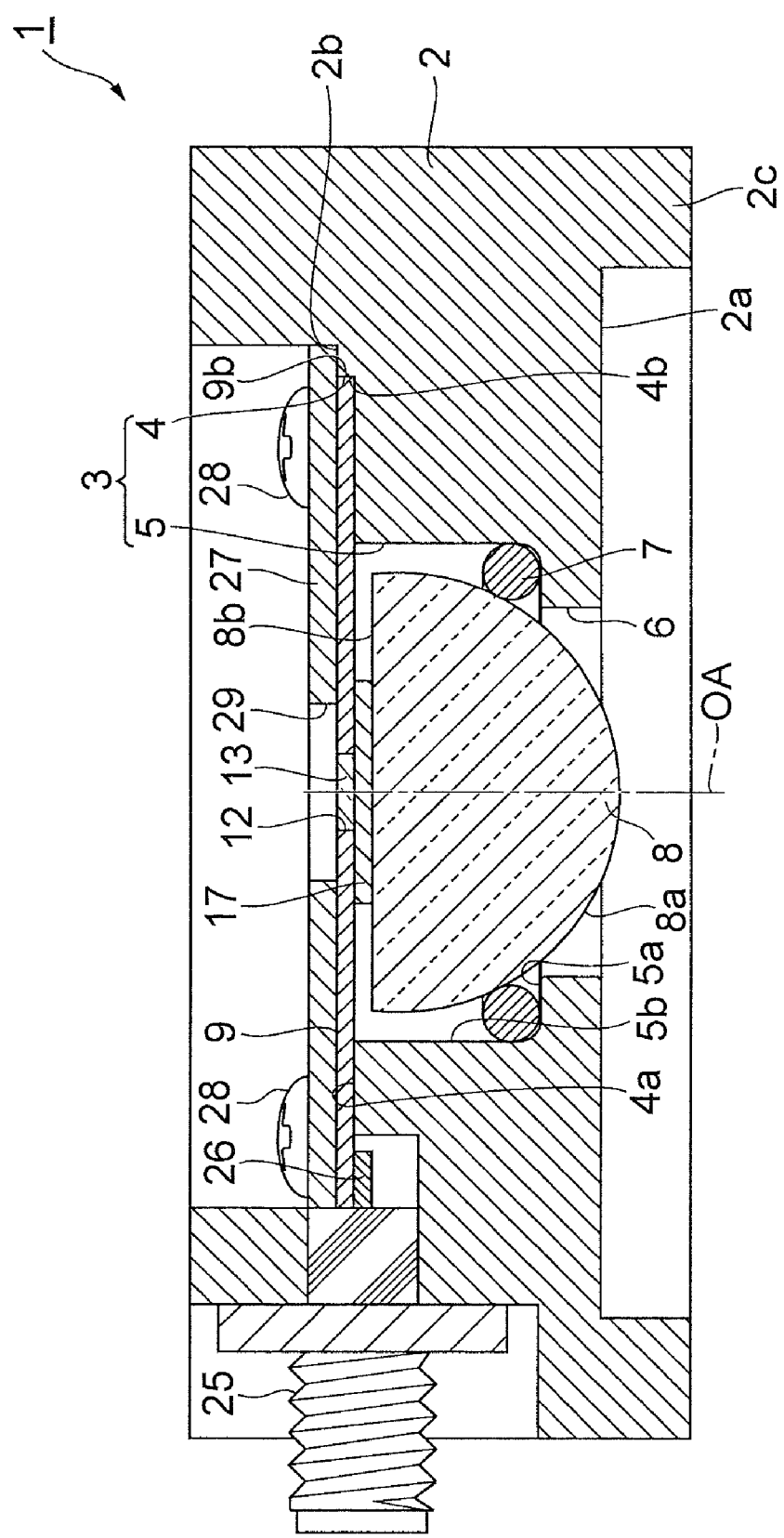
FIG. 2 is a sectional view of the terahertz electromagnetic wave generating/detecting module taken along the line II-II of FIG. 1.

FIG. 1 is a rear view of a terahertz electromagnetic wave generating/detecting module in which each of the embodiments of the photoconductive antenna element according to the present invention is employable. FIG. 2 is a sectional view of the terahertz electromagnetic wave generating/detecting module taken along the line II-II of FIG. 1. As shown in FIGS. 1 and 2, the terahertz electromagnetic wave generating/detecting module 1 is an apparatus for generating a terahertz electromagnetic wave and emitting it forward (downward in FIG. 2) or detecting a terahertz electromagnetic wave incident thereon from the front side (the lower side in FIG. 2).

The terahertz electromagnetic wave generating/detecting module 1 comprises a rectangular parallelepiped base 2 composed of a metal. The base 2 has a rear face 2b formed with a depression 3. The depression 3 includes a depression 4 (having a rectangular opening) formed in the rear face 2b of the base 2 and a depression 5 (having a circular opening) formed at the bottom face 4a of the depression 4. The bottom face 5a of the depression 5 (i.e., the bottom face of the depression 3) is formed with an opening 6 extending from the bottom face 5a of the depression 5 to the front face 2a of the base 2. A frame 2c is formed about the front face 2a of the base 2 in order to protect the leading end of a hemispherical lens 8 which will be explained later.

At the depression 5, an annular buffer member 7 such as an O-ring is arranged so as to surround the opening 6 while in contact with the bottom face 5a and side face 5b of the depression 5. The hemispherical lens 8 transparent to the terahertz electromagnetic wave is arranged such that its spherical part 8a is in contact with the buffer member 7. The hemispherical lens 8 has a flat part 8b arranged substantially parallel to the bottom face 4a of the depression 4, while the vertex of the spherical part 8a is exposed to the outside through the opening 6. Highly resistant silicon having a high transparency to the terahertz electromagnetic wave is suitable as a material for the hemispherical lens 8, while a super spherical form is preferred as the form of the hemispherical lens 8 in order to efficiently radiate or collect the terahertz electromagnetic wave.

Figure 3:
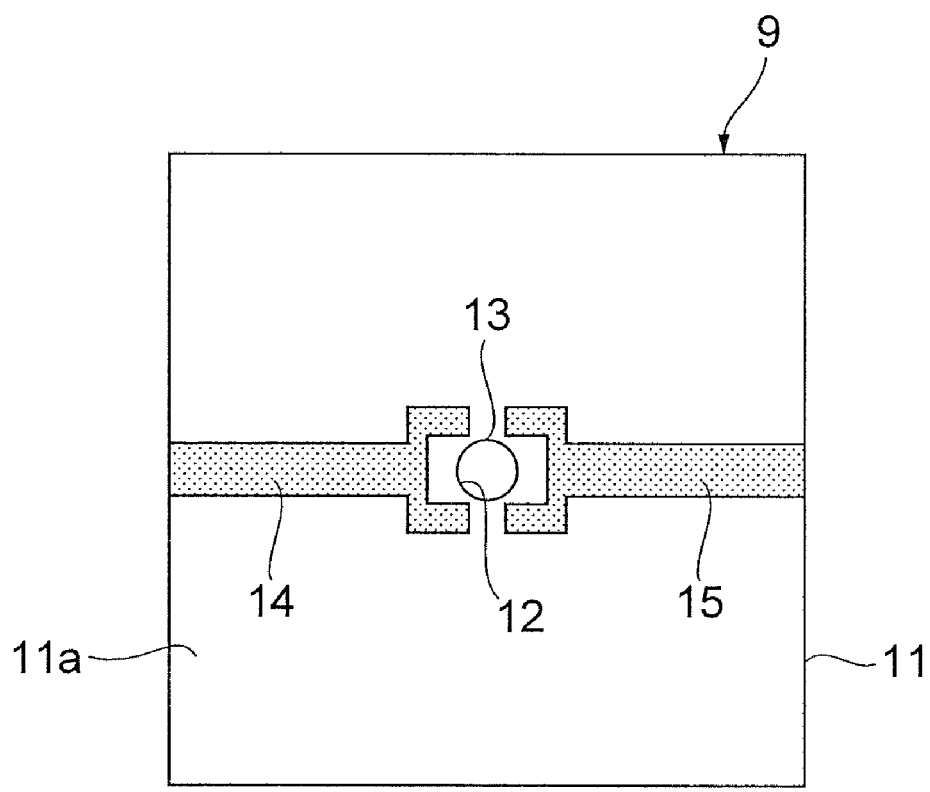
FIG. 3 is a front view of a wiring board of the terahertz electromagnetic wave generating/detecting module shown in FIG. 1.

A rectangular wiring board 9 is arranged in the depression 4 such that a side face 9b thereof extends along a side face 4b of the depression 4. FIG. 3 is a front view of the wiring board of the terahertz electromagnetic wave generating/detecting module shown in FIG. 1. As shown in FIG. 3, the wiring board 9 has a rectangular substrate 11 composed of an insulating material such as a ceramic or an epoxy resin incorporating glass therein. The center part of the substrate 11 is formed with a light-transmitting hole 12 (having a circular opening) for transmitting therethrough visible or infrared light entering from the rear side (the upper side in FIG. 2). A light-transmitting material 13 composed of a material transparent to the visible or infrared light such as glass or silica is fitted in the light-transmitting hole 12. This can protect the front face of a photoconductive antenna element 17 which will be explained later.

On the front face 11a of the substrate 11, a signal lead (external lead) 14 and a grounding lead (external lead) 15 which are composed of a metal are formed such as to oppose each other across the light-transmitting hole 12. The signal lead 14, which is a lead for transmitting an electric signal, is electrically connected to an electrode signal I/O pin 26 of an electric signal I/O port 25 which will be explained later. The grounding lead 5, which is a lead for grounding, is electrically connected to the base 2 having conductivity.

Figure 4:
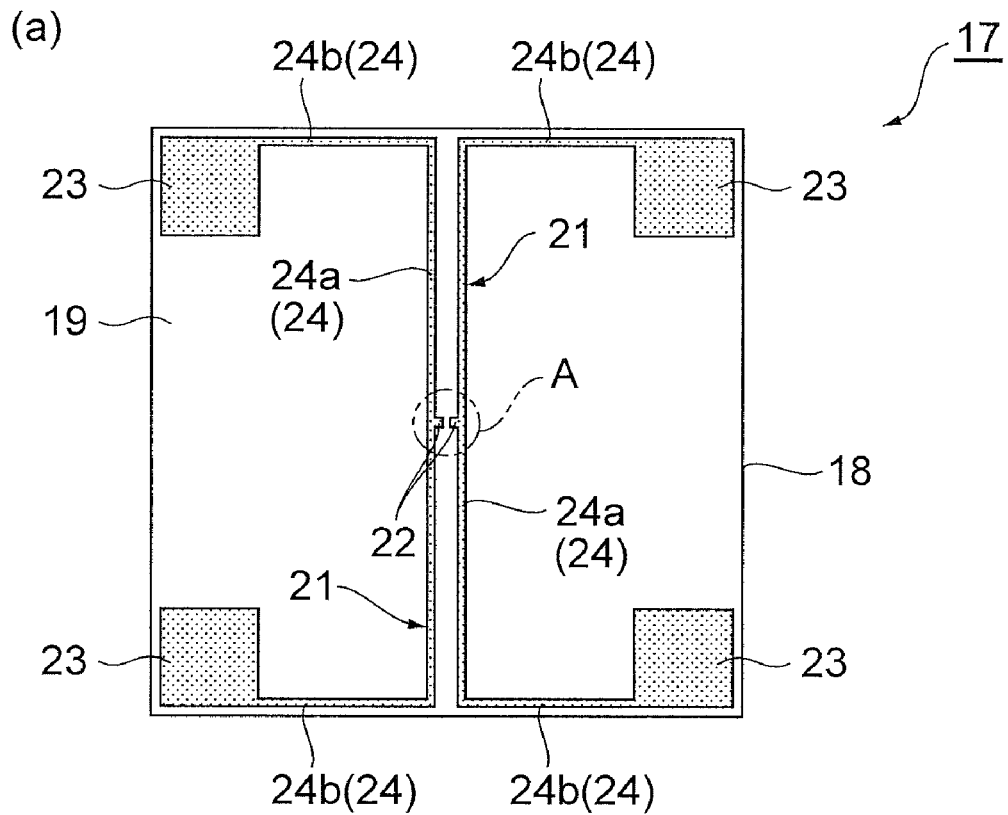
FIG. 4 is a rear view of the first embodiment of the photoconductive antenna element employable in the terahertz electromagnetic wave generating/detecting module shown in FIG. 1.
Figure 4:
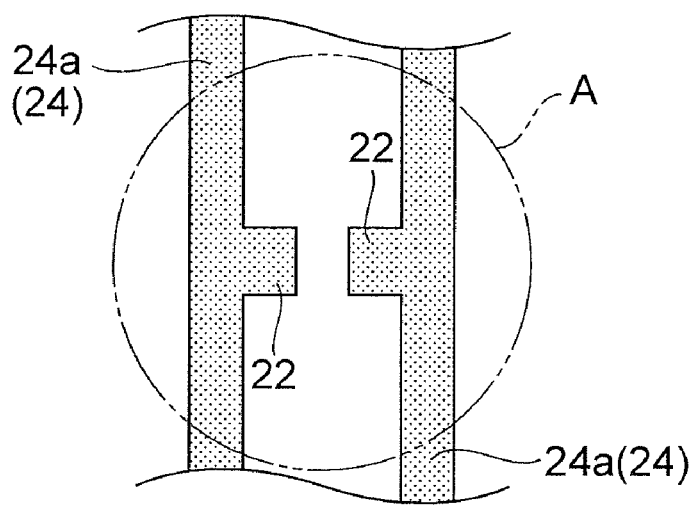

As shown in FIG. 2, the photoconductive antenna element 17 shaped like a thin square sheet is secured to the wiring board 9 while in contact with the flat part 8b of the hemispherical lens 8. FIG. 4 is a rear view of the first embodiment of the photoconductive antenna element employable in the terahertz electromagnetic wave generating/detecting module shown in FIG. 1. In particular, in FIG. 4, the area (a) shows the rear face of the element as a whole, while the area (b) shows an enlarged view of the antenna region indicated by A in the area (a). As shown in FIG. 4, the photoconductive antenna element 17 according to the first embodiment, which is an element for generating or detecting the terahertz electromagnetic wave, comprises a semi-insulating GaAs substrate 18, a GaAs substrate (semiconductor layer) 19 formed on the semi-insulating GaAs substrate 18 by low-temperature MBE (Molecular Beam Epitaxy), and a pair of ohmic electrodes (electrodes) 21 formed on the GaAs layer 19. The ohmic electrodes 21 are composed of AuGe, Au, or the like.

One of the pair of ohmic electrodes 21 (hereinafter referred to as the first electrode) is constituted by an antenna part 22 in a dipole pattern forming the antenna region A for generating or detecting the terahertz electromagnetic wave, pad parts 23 connectable to external leads, and a line part 24 connecting the antenna part 22 to the pad parts 23. The antenna part 22 is formed at the center part on the GaAs layer 19, while the pad parts 23 are formed at both corner portions in one edge part on the GaAs layer 19.

The line part 24 in the first electrode extends from the antenna part 22 to both sides thereof and is bent opposite to the other of the pair of ohmic electrodes 21 (hereinafter referred to as the second electrode) on the outside of the antenna region A. More specifically, the line part 24 of the first electrode includes a linear parallel portion 24*a* extending from the antenna part 22 to both sides thereof in directions substantially orthogonal to a direction in which the antenna parts of the pair of ohmic electrodes 21 oppose each other, and linear lead portions 24*b* turning substantially at right angles from both ends of the parallel portion 24*a* so as to reach the respective pad portions 23. The lead portions 24*b* are formed along respective edge parts substantially orthogonal to one edge part on the GaAs layer 19.

Similarly, the second electrode is constituted by an antenna part 22 in a dipole pattern forming the antenna region A for generating or detecting the terahertz electromagnetic wave, pad parts 23 connectable to external leads, and a line part 24 connecting the antenna part 22 to the pad parts 23. The antenna part 22 is formed at the center part on the GaAs layer 19, while the pad parts 23 are formed at both corner portions in the other edge part on the GaAs layer 19.

The line part 24 in the second electrode extends from the antenna part 22 to both sides thereof and is bent opposite to the first electrode on the outside of the antenna region A. More specifically, the line part 24 of the second electrode includes a linear parallel portion 24*a* extending from the antenna part 22 to both sides thereof in a direction substantially orthogonal to a direction in which the antenna parts of the pair of ohmic electrodes 21 oppose each other, and linear lead portions 24*b* turning substantially at right angles from both ends of the parallel portion 24*a* so as to reach the respective pad portions 23. The lead portions 24*b* are formed along respective edge parts substantially orthogonal to the other edge part on the GaAs layer 19.

Figure 5:
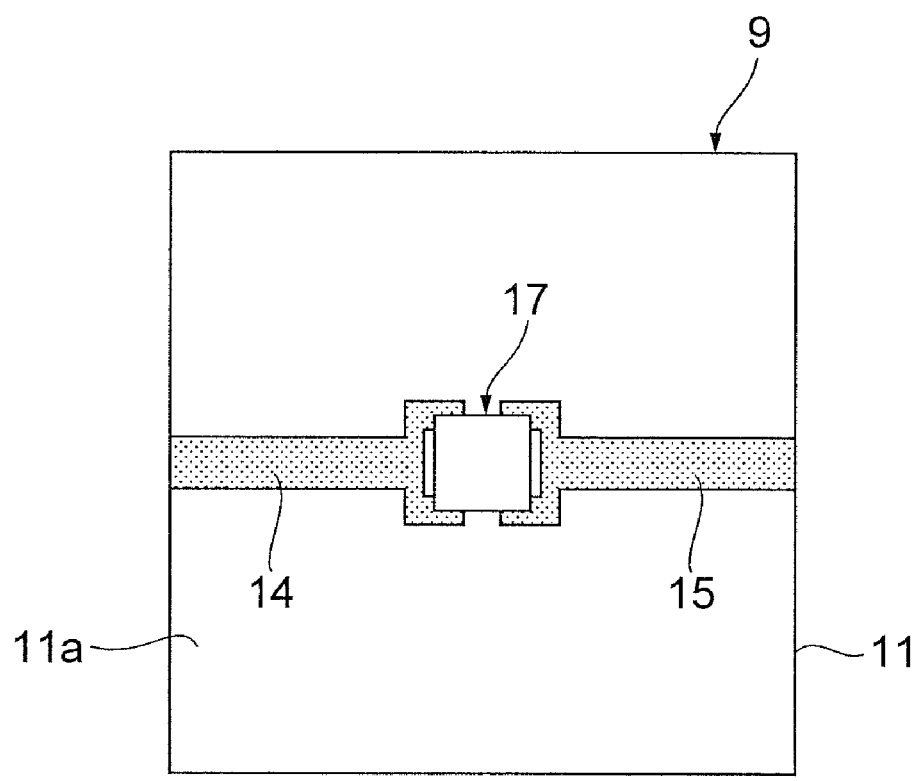
FIG. 5 is a front view of the wiring board (FIG. 3) to which the photoconductive antenna element according to the first embodiment is attached.

FIG. 5 is a front view of the wiring board of FIG. 3 to which the photoconductive antenna element 17 (FIG. 4) according to the first embodiment is attached. As shown in FIG. 5, the photoconductive antenna element 17 is mounted onto the wiring board 9 by flip-chip bonding such that the antenna parts 22 oppose the light-transmitting hole 12 of the substrate 11 (i.e., the visible to infrared light transmitted through the substrate 11 irradiates the antenna parts 22). Bumps of Au and solder, Ag pastes, conductive epoxy resins, and the like are used for bonding. The first electrode of the photoconductive antenna element 17 is electrically connected to the signal lead 14 of the wiring board 9 through the pad parts 23, while the second electrode of the photoconductive antenna element 17 is electrically connected to the grounding lead 15 of the wiring board 9 through the pad parts 23.

As shown in FIGS. 1 and 2, the electric signal I/O port 25 is attached to the base 2 with screws or the like. The electrode signal I/O pin 26 of the electric signal I/O port 25 is electrically connected to the signal lead 14 formed on the front face 11*a* of the substrate 11 in the wiring board 9. A coaxial connector such as SMA or BNC which is compact and universal can be used as the electric signal I/O port 25.

A cover 27 formed like a thin rectangular sheet is attached to the rear face 2*b* of the base 2 with screws 28. The cover 27 is formed with a light-transmitting hole 29 surrounding the light-transmitting hole 12 of the wiring board 9. The cover 27 presses the wiring board 9, photoconductive antenna element 17, and hemispherical lens 8 against the buffer member 7, while pressing the wiring board 9 against the electric signal I/O pin 26 of the electric signal I/O port 25 and the bottom face 4*a* of the depression 4 of the base 2. Though a metal is preferably used as a material for the cover 27 so as to make it function as a leaf spring which can reliably and easily press the wiring board 9 and the like against the buffer member 7, ceramics, plastics, and the like may also be used.

In the state where the cover 27 presses the wiring board 9, photoconductive antenna element 17, and hemispherical lens 8 against the buffer member 7, the wiring board 9 and hemispherical lens 8 are positioned by the depression 4 and buffer member 7, respectively, such that the optical axis OA of the hemispherical lens 8 passes through the antenna part 22 of the photoconductive antenna element 17.

Operations of thus constructed terahertz electromagnetic wave generating/detecting module 1 will now be explained.

When the terahertz electromagnetic wave generating/detecting module 1 is used as a terahertz electromagnetic wave generating module, a bias voltage is applied between the pair of ohmic electrodes 21 through the electric signal I/O port 25 and the signal lead 14 of the wiring board 9. Then, the antenna part 22 of the photoconductive antenna element 17 is irradiated with visible or infrared light as pumping light through the light-transmitting hole 12 of the wiring board 9. As a consequence, free carriers pumped at the GaAs layer 19 of the photoconductive antenna element 17 are accelerated with an electric field caused by the bias voltage, whereby a current flows between the pair of ohmic electrodes 21. This change in current generates a terahertz electromagnetic wave in the antenna region A of the photoconductive antenna element 17, which is emitted forward through the hemispherical lens 8.

When the terahertz electromagnetic wave generating/detecting module 1 is used as a terahertz electromagnetic wave detecting module, the antenna part 22 of the photoconductive antenna element 17 is irradiated with visible or infrared light as pumping light through the light-transmitting hole 12 of the wiring board 9, whereby free carriers are pumped at the GaAs layer 19 of the photoconductive antenna element 17. When a terahertz electromagnetic wave is incident on the antenna region A of the photoconductive antenna element 17 through the hemispherical lens 8 from the front side at this time, the free carriers pumped at the GaAs layer 19 are accelerated with an electric field caused by the terahertz electromagnetic wave, whereby a current flows between the pair of ohmic electrodes 21 of the photoconductive antenna element 17. This current is detected through the signal lead 14 of the wiring board 9 and the electric signal I/O port 25.

In the photoconductive antenna element 17 employed in the terahertz electromagnetic wave generating/detecting module 1, as explained in the foregoing, the line parts 24 connecting the antenna parts 22 to the pad parts 23 in a pair of ohmic electrodes 21 include the parallel portions 24*a* extending in a direction substantially orthogonal to the direction in which the antenna parts 22 oppose each other between the pair of ohmic electrodes 21. The line part 24 of the first electrode, which is one of the pair of ohmic electrodes 21, is bent opposite to the second electrode (the other of the pair of ohmic electrodes 21) on the outside of the antenna region A, while the line part 24 of the second electrode is bent opposite to the first electrode on the outside of the antenna region A. This can arrange the antenna parts 22, pad parts 23, and line parts 24 efficiently on the GaAs layer 19 and yield characteristics equivalent or superior to those of conventional photoconductive antenna elements whose line part has a predetermined linear length. Thus, by bending the line parts 24 on the outside of the antenna region A, the photoconductive antenna element 17 can reduce its size while preventing its characteristics from deteriorating.

Characteristics of the photoconductive antenna element according to the first embodiment will now be explained in comparison with a plurality of kinds of comparative examples. First, respective photoconductive antenna elements according to Comparative Examples 1 and 2 were prepared together with the first embodiment, and characteristics of the photoconductive antenna elements were measured by a terahertz electromagnetic wave measurement system.

Figure 6:
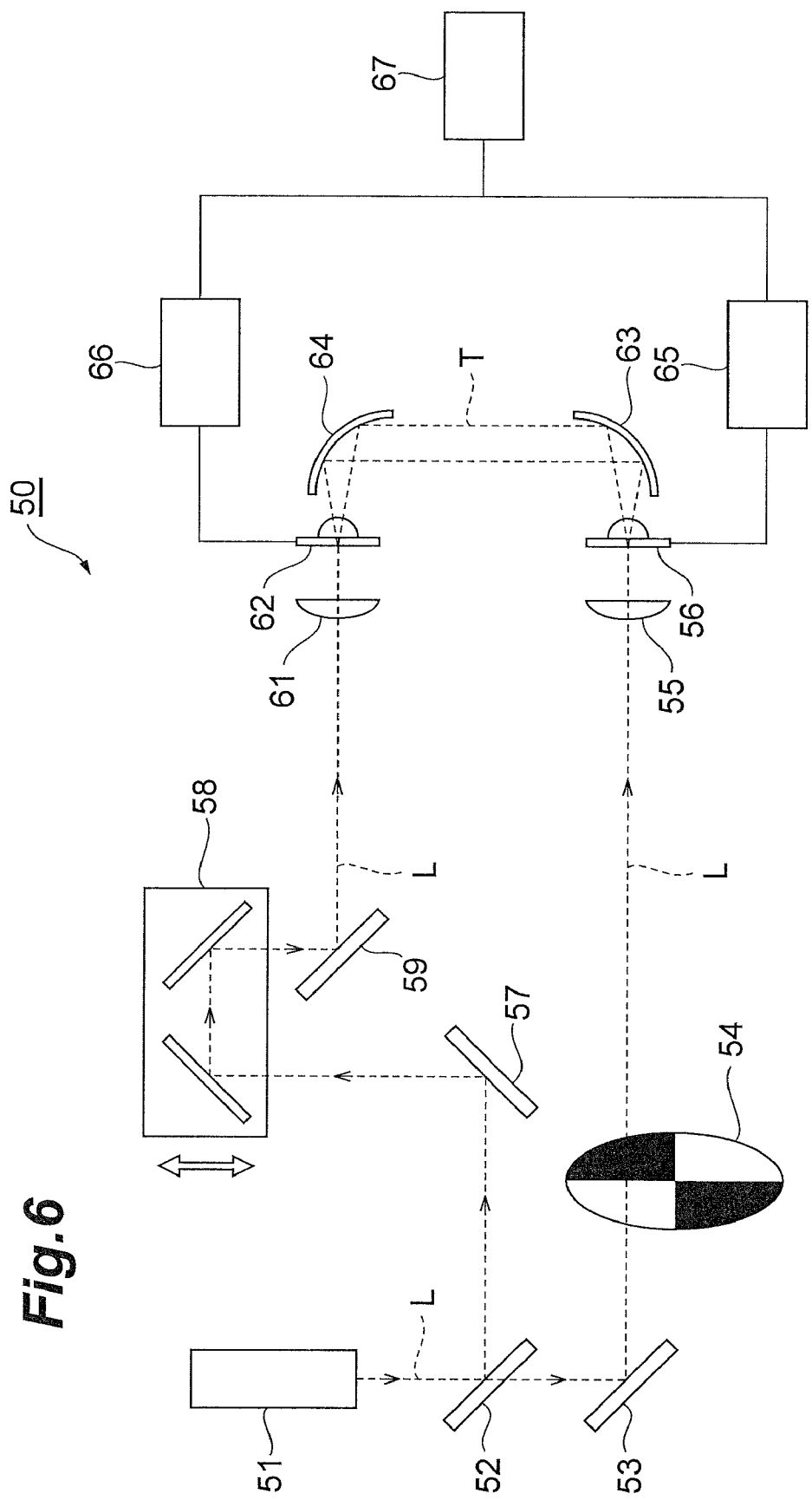
FIG. 6 is a diagram showing the structure of a terahertz electromagnetic wave measurement system.

FIG. 6 is a diagram showing the structure of the terahertz electromagnetic wave measurement system. In the terahertz electromagnetic wave measurement system 50, as shown in FIG. 6, a laser beam L emitted from an ultrashort pulsed laser 51 is split by a beam splitter 52 in the middle of its optical path. The laser beam L transmitted through the beam splitter 52 travels a mirror 53, a chopper 54, and a condenser lens 55 in sequence, so as to enter a photoconductive antenna element of a terahertz electromagnetic wave generating module 56. On the other hand, the laser beam L reflected by the beam splitter 52 travels a mirror 57, a mirror 58 movable along its optical axis (for which a retroreflector is typically used), a mirror 59, and a condenser lens 61 in sequence, so as to enter a photoconductive antenna element of a terahertz electromagnetic wave detecting module 62. The terahertz electromagnetic wave generating module 56 and the terahertz electromagnetic wave detecting module 62 are constructed similar to the above-mentioned terahertz electromagnetic wave generating/detecting module 1.

A terahertz electromagnetic wave T radiated from the terahertz electromagnetic wave generating module 56 is guided to the terahertz electromagnetic wave detecting module 62 by paraboloidal mirrors 63, 64, so as to cause a correlated action with the laser beam L. Here, a bias voltage is applied from a DC voltage source 65 to the photoconductive antenna element of the terahertz electromagnetic wave generating module 56, while a lock-in amplifier 66 is connected to the photoconductive antenna element of the terahertz electromagnetic wave detecting module 62. As the mirror 58 is translated, time-correlated waveforms of the terahertz electromagnetic wave T and laser beam L are obtained, which are then Fourier-transformed by a computer 67, so as to yield a spectrum of the terahertz electromagnetic wave.

The photoconductive antenna elements according to the first embodiment and Comparative Examples 1 and 2 were employed for the terahertz electromagnetic wave generating module 56 and terahertz electromagnetic wave detecting module 62 in the terahertz electromagnetic wave measurement system constructed as in the foregoing, and characteristics of each photoconductive antenna element were measured.

With reference to FIG. 4, specific sizes of the photoconductive antenna element according to the first embodiment are such that, in terms of element sizes, the length in the direction in which the antenna parts 22 oppose each other between the pair of ohmic electrodes 21 is 4 mm, while the length in a direction substantially orthogonal to the opposing direction is 3.6 mm. In the ohmic electrodes 21, the width of the line part 24 is 5 µm, the width of the antenna part 22 is 10 µm, the gap between the parallel portions 24a, 24a opposing each other is 20 µm, and the gap between the antenna parts 22, 22 opposing each other is 5 µm.

Figure 7:
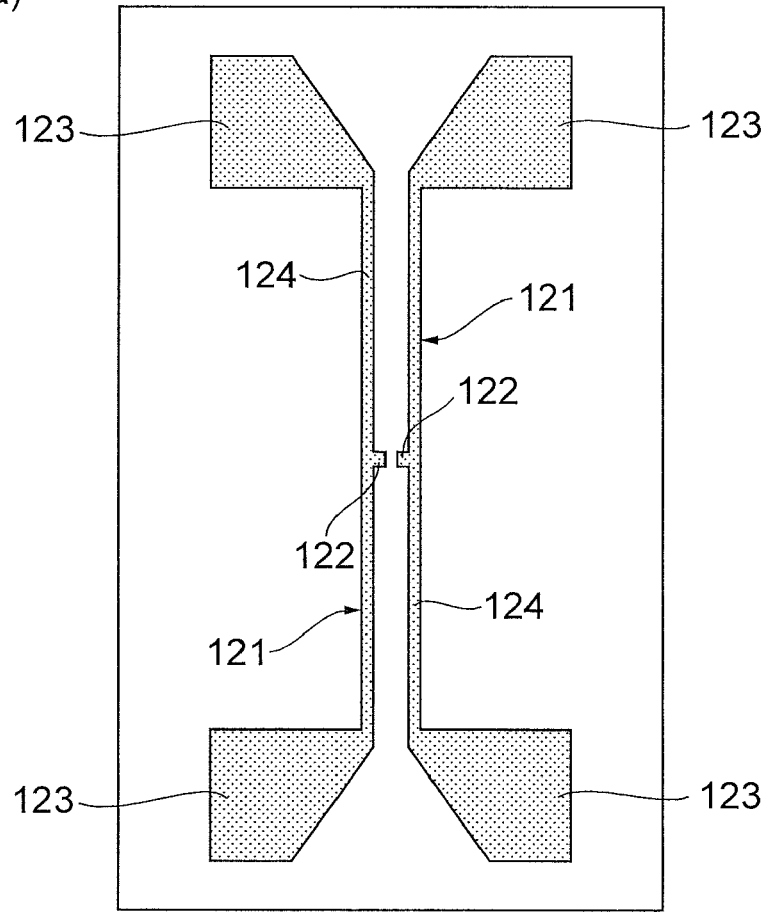
FIG. 7 is a rear view of the photoconductive antenna element according to Comparative Example 1.
Figure 7:
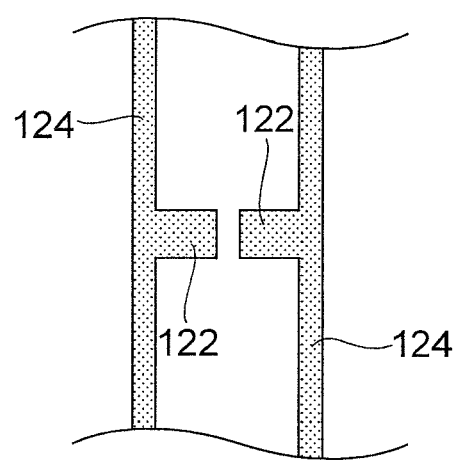

FIG. 7 is a rear view of the photoconductive antenna element according to Comparative Example 1. In particular, in FIG. 7, the area (a) shows the rear face of the element as a whole, while the area (b) shows an enlarged view of the antenna region. The photoconductive antenna element of Comparative Example 1 differs from that of the embodiment in that line parts connecting antenna parts to pad parts in a pair of ohmic electrodes are formed linearly. With reference to FIG. 7, specific sizes of the photoconductive antenna element according to Comparative Example 1 are such that, in terms of element sizes, the length in the direction in which antenna parts 122 oppose each other between a pair of ohmic electrodes 121 is 6 mm and the length in a direction substantially orthogonal to the opposing direction is 10 mm. For each of electrodes constituting the pair of ohmic electrodes 121, the length of the line part 124 is 6 mm, the width of the line part 124 is 5 µm, and the width of the antenna part 122 is 10 µm. In the pair of ohmic electrodes 121, the gap between the line parts 124 opposing each other is 20 µm, and the gap between the antenna parts 122 opposing each other is 5 µm.

Figure 8:
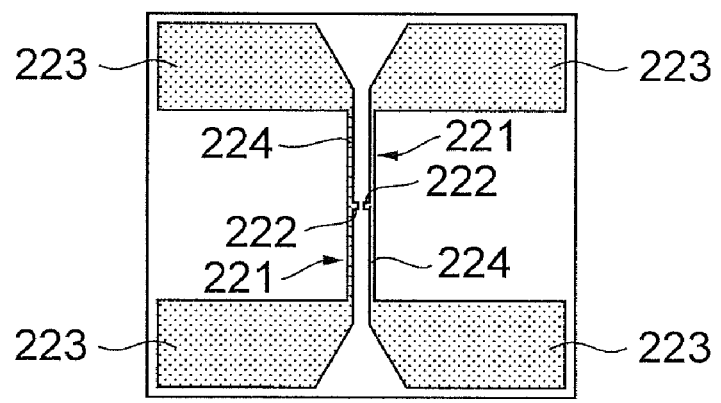
FIG. 8 is a rear view of the photoconductive antenna element according to Comparative Example 2.
Figure 8:
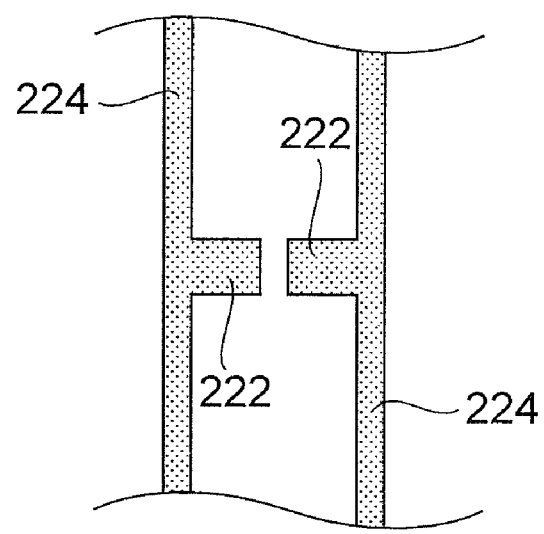

FIG. 8 is a rear view of the photoconductive antenna element according to Comparative Example 2. In particular, in FIG. 8, the area (a) shows the rear face of the element as a whole, while the area (b) shows an enlarged view of the antenna region. The photoconductive antenna element of Comparative Example 2 differs from that of the embodiment in that line parts connecting antenna parts to pad parts in a pair of ohmic electrodes are formed linearly. With reference to FIG. 8, specific sizes of the photoconductive antenna element according to Comparative Example 2 are such that, in terms of element sizes, the length in the direction in which antenna parts 222 oppose each other between a pair of ohmic electrodes 221 is 4 mm and the length in a direction substantially orthogonal to the opposing direction is 3.6 mm. For each of electrodes constituting the pair of ohmic electrodes 221, the length of the line part 224 is 1.4 mm, the width of the line part 224 is 5 and the width of the antenna part 222 is 10 µm. In the pair of ohmic electrodes 221, the gap between the line parts 224 opposing each other is 20 µm, and the gap between the antenna parts 222 opposing each other is 5 µm.

Figure 9:
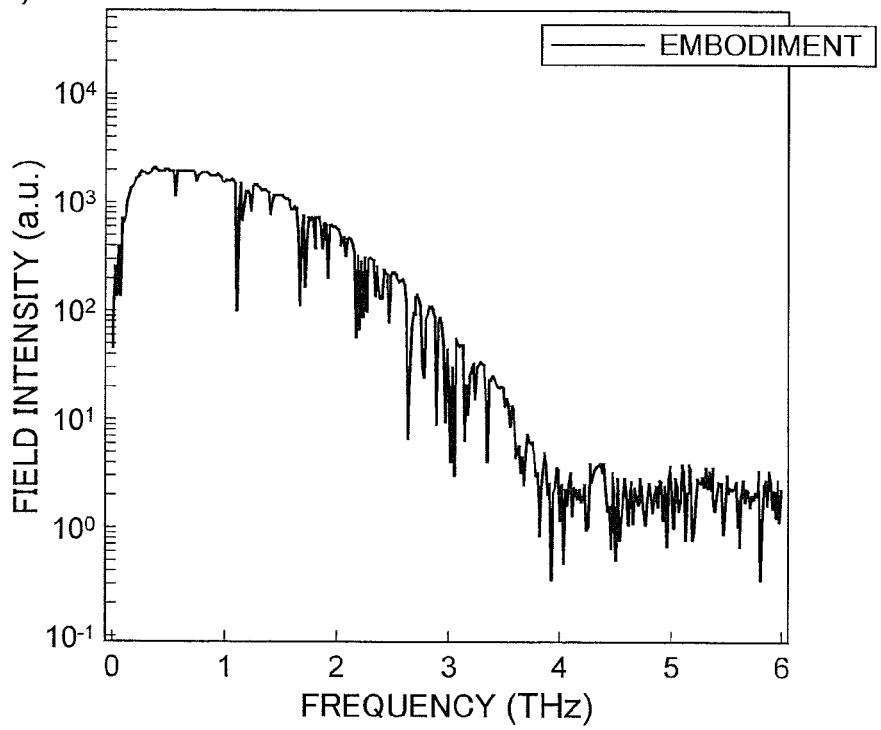
FIG. 9 is a graph showing characteristics of the photoconductive antenna elements according to the first embodiment and Comparative Examples 1 and 2.
Figure 9:
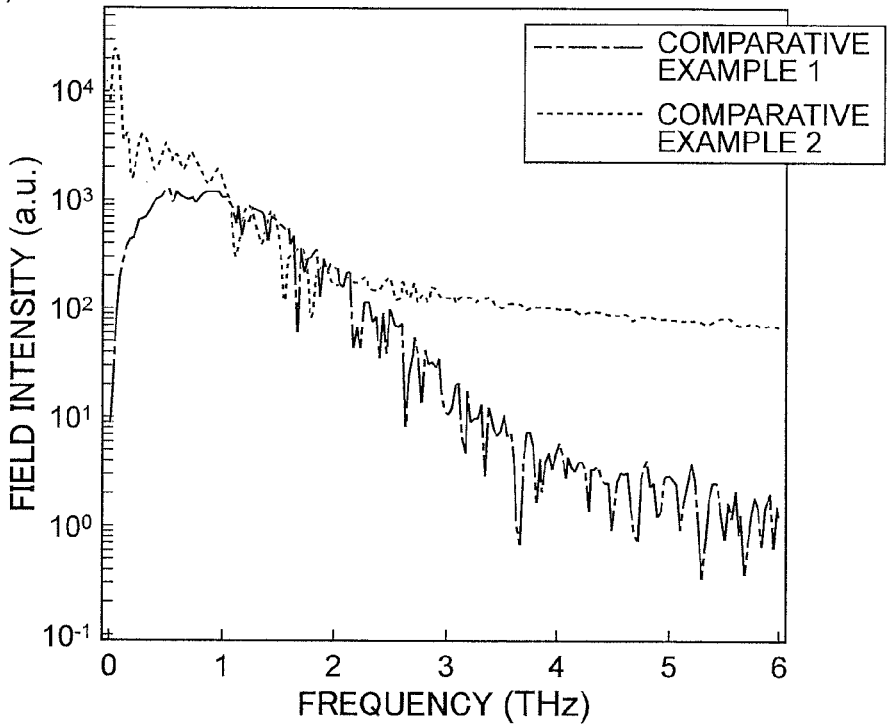

FIG. 9 is a graph showing characteristics of the photoconductive antenna elements according to the first embodiment and Comparative Examples 1 and 2. In general, photoconductive antenna elements can be used in frequency regions corresponding to a range of field intensity up to $10^{-2}$ times a peak value. Hence, as shown in the area (b) of FIG. 9, the photoconductive antenna element according to Comparative Example 1 is usable up to about 3 THz. In contrast, the photoconductive antenna element according to Comparative Example 2 reducing the size of the photoconductive antenna element according to Comparative Example 1 can only be used at 2 THz or lower, since spiky peaks occur in a low frequency region. Thus, the photoconductive antenna elements according to Comparative Examples 1 and 2 in which the line parts connecting the antenna and pad parts to each other are formed linearly in the ohmic electrodes have been deterred from being made smaller, since their characteristics will deteriorate unless the line parts have a predetermined linear length.

On the other hand, as shown in the area (a) of FIG. 9, the photoconductive antenna element according to the first embodiment is usable up to about 3 THz as with the photoconductive antenna element according to Comparative Example 1, while being made as small as the photoconductive antenna element according to Comparative Example 2 in terms of element sizes. It has thus become clear that, by bending the line parts on the outside of the antenna region, the photoconductive antenna element according to the first embodiment can reduce its size while preventing its characteristics from deteriorating.

Figure 10:
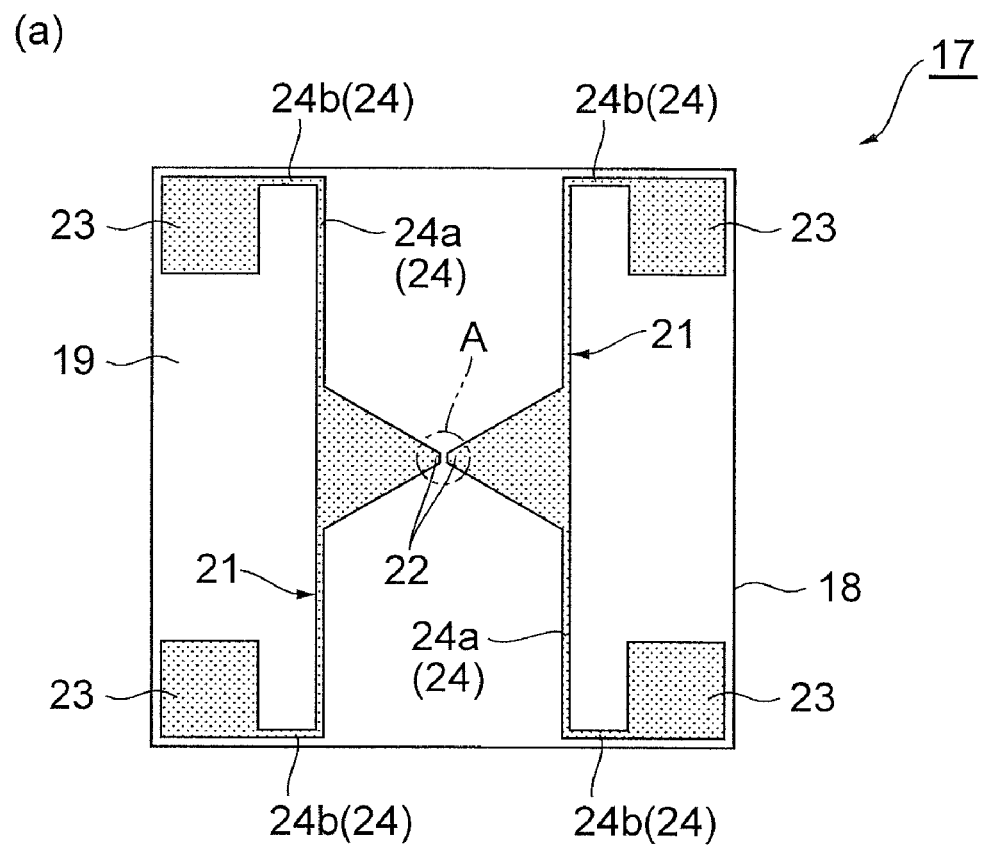
FIG. 10 is a rear view of the second embodiment of the photoconductive antenna element according to the present invention.
Figure 10:
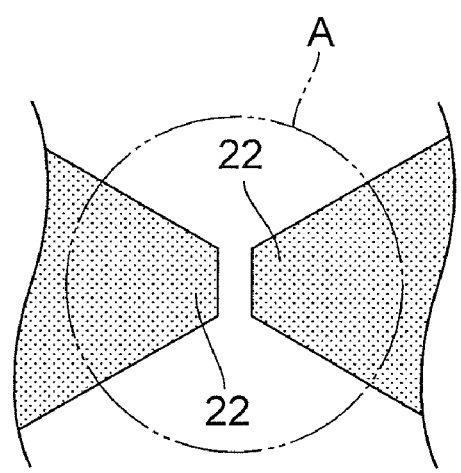

The present invention is not limited to the above-mentioned first embodiment. For example, the pattern of the antenna parts 22 is not limited to a dipole pattern, but may be a bowtie pattern as in the photoconductive antenna element according to the second embodiment, a strip-line pattern (i.e., one not projecting from the parallel portions 24*a*), a spiral pattern, or the like. In FIG. 10, the area (a) shows the rear face of the photoconductive antenna element according to the second embodiment as a whole, while the area (b) shows an enlarged view of the antenna region indicated by A in the area (a). When the antenna parts 22 are in a spiral pattern or the like, the direction in which the parallel portions 24*a* extend is not limited to a direction substantially orthogonal to the direction in which the antenna parts 22 oppose each other between the pair of ohmic electrodes 21.

Figure 11:
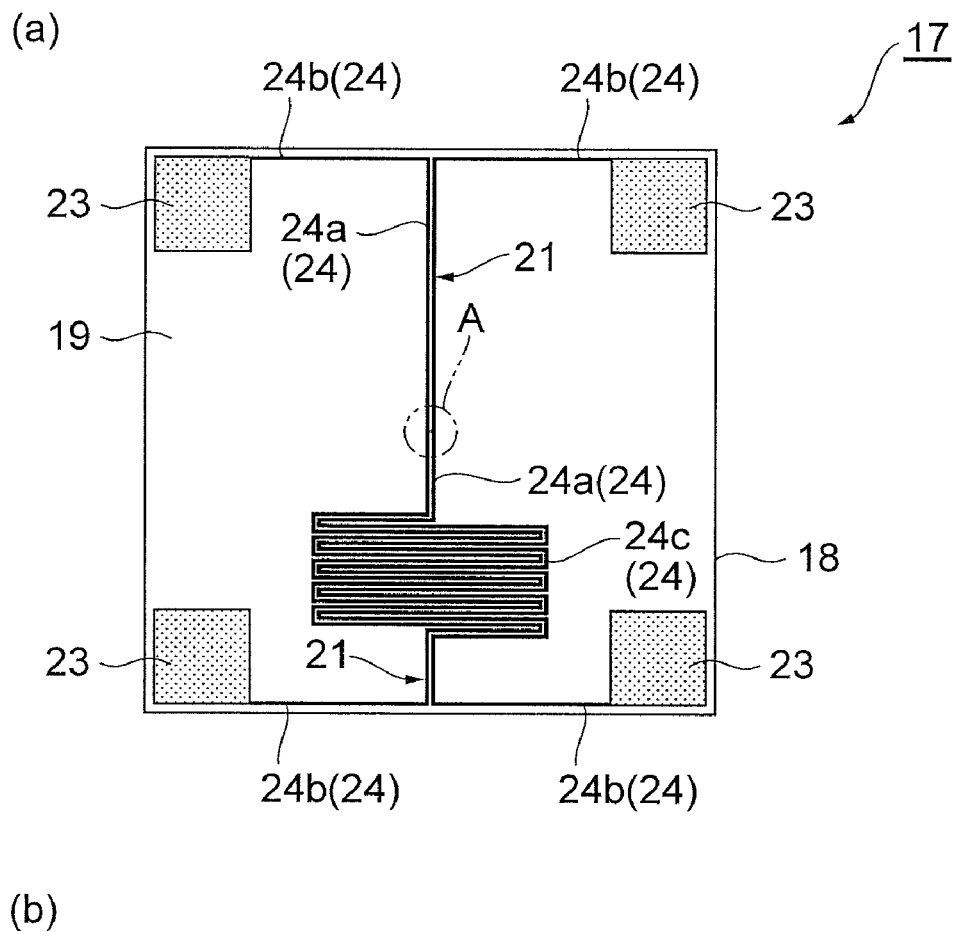
FIG. 11 is a rear view of the third embodiment of the photoconductive antenna element according to the present invention.
Figure 11:
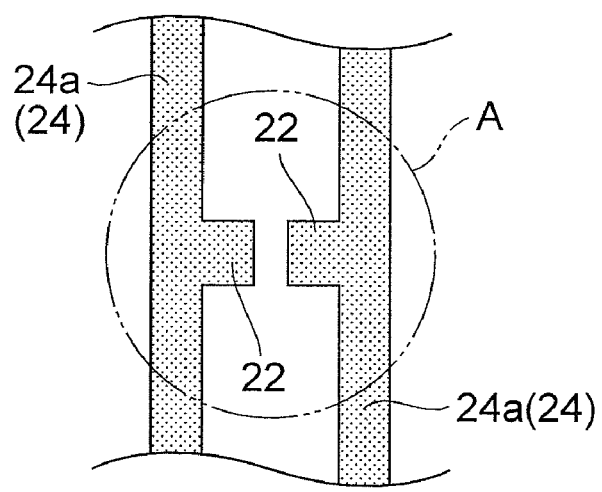
Figure 12:
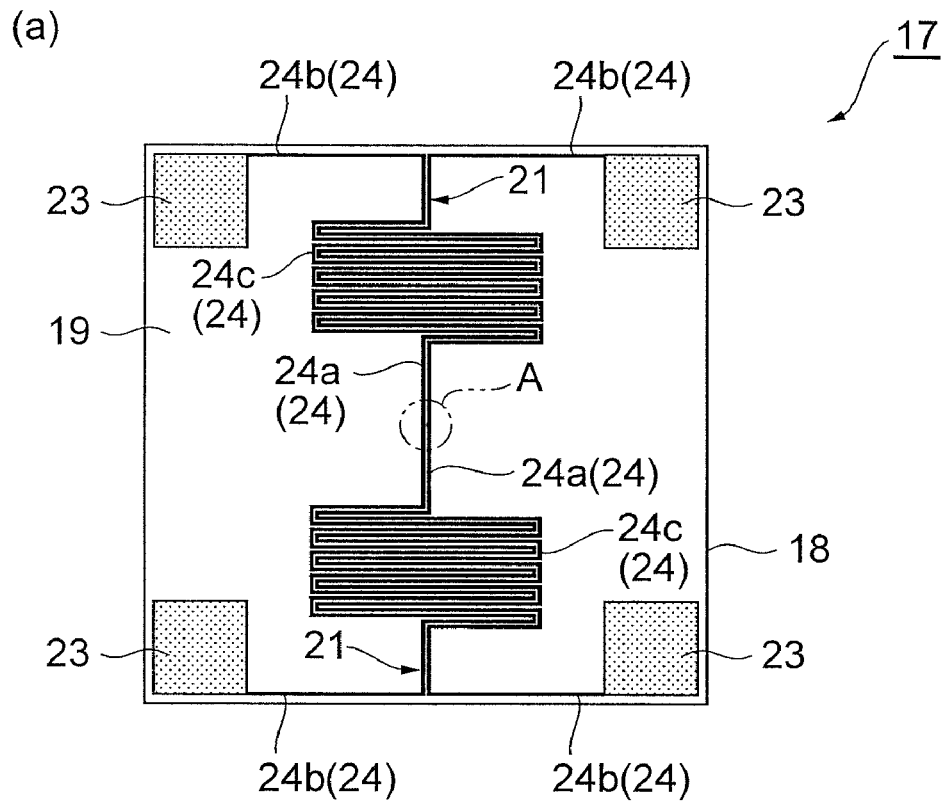
FIG. 12 is a rear view of the fourth embodiment of the photoconductive antenna element according to the present invention.
Figure 12:
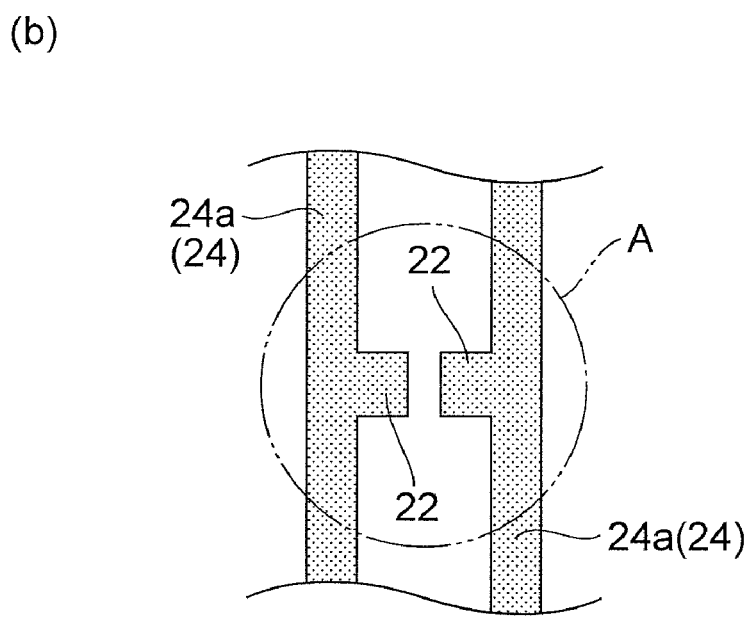
Figure 13:
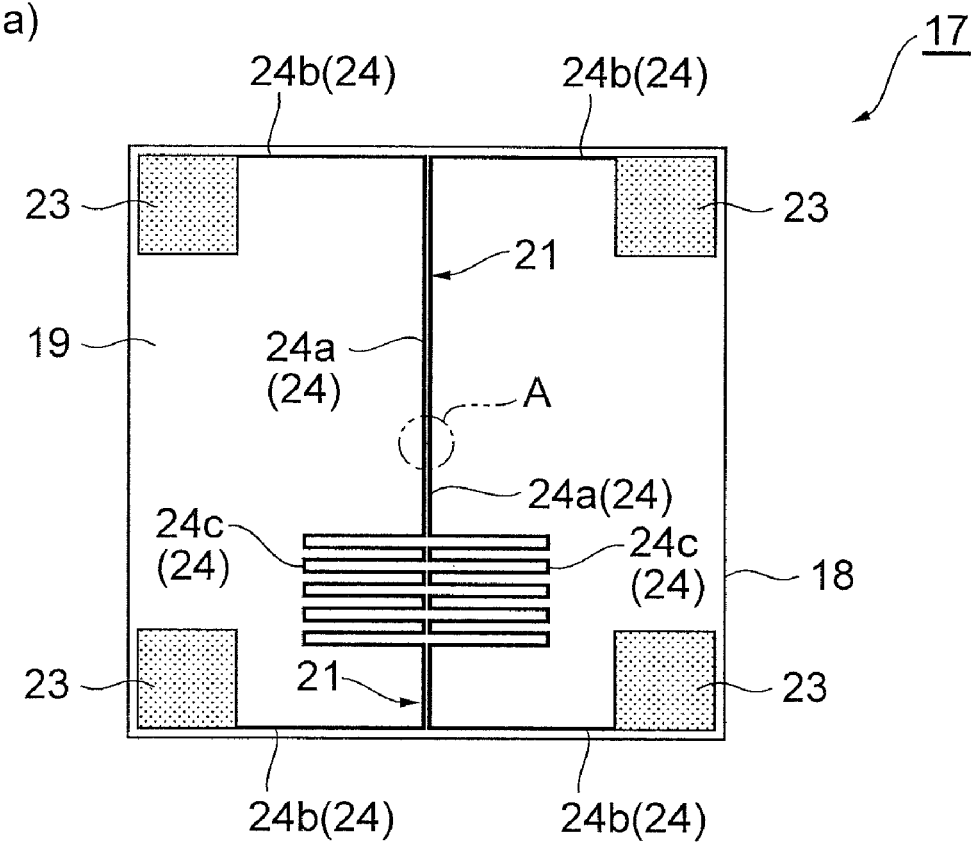
FIG. 13 is a rear view of the fifth embodiment of the photoconductive antenna element according to the present invention.
Figure 13:
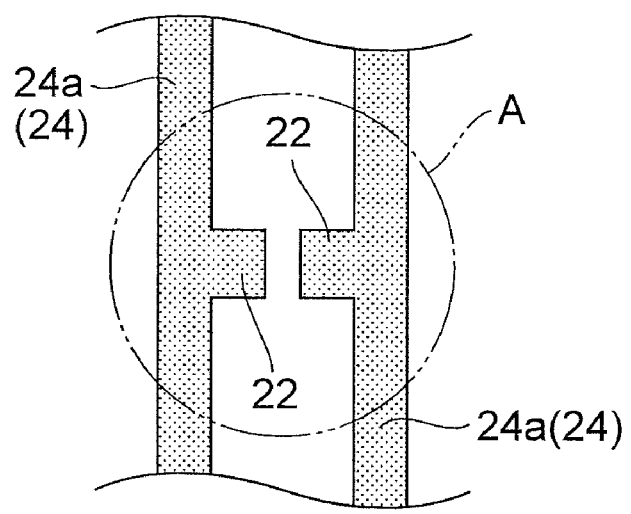
Figure 14:
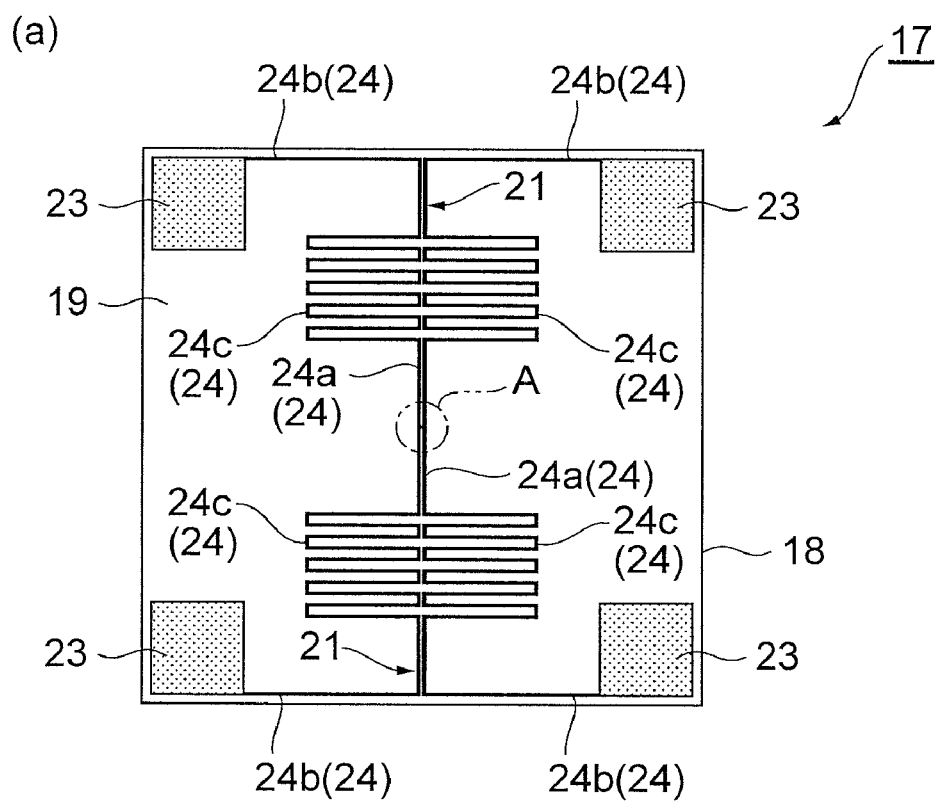
FIG. 14 is a rear view of the sixth embodiment of the photoconductive antenna element according to the present invention.
Figure 14:
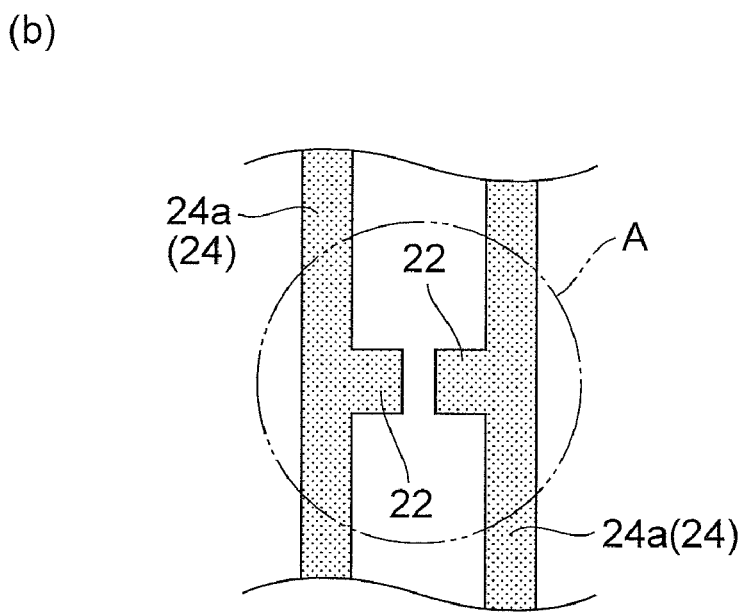

The line parts 24 may include a routing portion 24*c* routed on the outside of the antenna region A. As in the photoconductive antenna element according to the third embodiment shown in FIG. 11, the routing portion 24*c* may include a plurality of linear elements such that the line parts 24 are parallel to each other and travel back and forth between one side and the other side. In FIG. 11, the area (a) shows the rear face of the photoconductive antenna element according to the second embodiment as a whole, while the area (b) shows an enlarged view of the antenna region indicated by A in the area (a). As in the photoconductive antenna element according to the fifth embodiment shown in FIG. 13, the routing portion 24*c* may have a form in which ends of linear elements are connected to adjacent linear elements different from each other such that one line part 24 travels back and forth only on the first electrode side, while the other line part 24 travels back and forth only on the second electrode side, thus partly routing the line parts 24. In FIG. 13, the area (a) shows the rear face of the photoconductive antenna element according to the fifth embodiment as a whole, while the area (b) shows an enlarged view of the antenna region indicated by A in the area (a). As in the photoconductive antenna element according to the fourth embodiment shown in FIG. 12 and the photoconductive antenna element according to the sixth embodiment shown in FIG. 14, routing portions 24*c* may be formed on both sides of the antenna region A. The photoconductive antenna elements according to these embodiments can achieve efficient routing and elongate the total length of the line parts 24, thereby making it possible to reliably keep characteristics equivalent or superior to those of the conventional photoconductive antenna elements in which the line parts have a predetermined linear length. FIGS. 12 and 14 show the respective rear faces of the photoconductive antenna elements according to the fourth and sixth embodiments in the area (a), while the area (b) represents an enlarged view of the antenna region indicated by A in the area (a).

The line parts 24 are not limited to those bent on the outside of the antenna region A as long as they are bent such as those curved.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

The invention claimed is:

1. A photoconductive antenna element for generating or detecting a terahertz electromagnetic wave, the photoconductive antenna element comprising:
   a semiconductor layer; and
   a pair of electrodes provided on the semiconductor layer;
   wherein each of the pair of electrodes has an antenna part forming an antenna region for generating or detecting a terahertz electromagnetic wave, a pair of pad parts each connected to an external lead, and a line part electrically connecting the pair of pad parts via the antenna part, and
   wherein the line part in each of the pair of electrodes is bent at two or more portions such that lead portions included in the line part are arranged in parallel.

2. A photoconductive antenna element according to claim 1, wherein the lead portions in the line part in one of the pair of electrodes and the lead portions in the line part in the other of the pair of electrodes extend in directions opposite to each other with respect to the antenna region.

3. A photoconductive antenna element according to claim 1, wherein the line part in one of the pair of electrodes is bent opposite to the other of the pair of electrodes, and
   wherein the line part in the other of the pair of electrodes is bent opposite to the one of the pair of electrodes.

4. A photoconductive antenna element according to claim 1, wherein the semiconductor layer includes a GaAs layer epitaxially grown on a semi-insulating GaAs substrate at a temperature lower than usual.

5. A photoconductive antenna element for generating or detecting a terahertz electromagnetic wave, the photoconductive antenna element comprising:
   a semiconductor layer; and
   a pair of electrodes provided on the semiconductor layer;
   wherein each of the pair of electrodes has an antenna part forming an antenna region for generating or detecting a terahertz electromagnetic wave, a pair of pad parts each connected to an external lead, and a line part connecting the antenna part and the pair of pad parts,
   wherein the line part in each of the pair of electrodes includes lead portions parallel to each other each arranged by bending at least one position between the antenna region and the associated one of the pair of pad parts, and
   wherein the line part of at least one of the pair of electrodes includes a routing portion located between the antenna part and one of the lead portions and constituted by a plurality of linear elements.

6. A photoconductive antenna element according to claim 5, wherein the plurality of linear elements constituting the routing portion are arranged parallel to the lead portions, while a linear element having both sides adjacent to linear elements is formed such as to have one end connected to one of the adjacent linear elements and the other end connected to the other of the adjacent linear elements.

7. A photoconductive antenna element for generating or detecting a terahertz electromagnetic wave, the photoconductive antenna element comprising:
   a semiconductor layer; and
   a pair of electrodes provided on the semiconductor layer;
   wherein one of the pair of electrodes has a first antenna part forming an antenna region for generating or detecting a terahertz electromagnetic wave, a pair of first pad parts each connected to an external lead, and a first line part electrically connecting the first pad parts via the first antenna part, the first line part being bent at two or more portions such that first lead portions included in the first line part are arranged in parallel, and wherein the other of the pair of electrodes has a second antenna part forming the antenna region together with the first antenna part, a pair of second pad parts each connected to an external lead, and a second line part electrically connecting the second pad parts via the second antenna part, the second line part being bent at two or more portions such that second lead portions included in the second line part are arranged in parallel.

* * * * *